US007411274B2

(12) United States Patent
Yamanaka et al.

(10) Patent No.: US 7,411,274 B2
(45) Date of Patent: Aug. 12, 2008

(54) SILICON SEMICONDUCTOR SUBSTRATE AND ITS MANUFACTURING METHOD

(75) Inventors: Hideki Yamanaka, Fukushima (JP); Kiyoshi Demizu, Tokyo (JP); Tadahiro Ohmi, 301, 1-17, Komegabukuro 2-chome, Aoba-ku, Sendai-shi, Miyagi 980-0813 (JP); Akinobu Teramoto, Sendai (JP); Shigetoshi Sugawa, Sendai (JP)

(73) Assignees: Shin-Etsu Handotai Co., Ltd., Tokyo (JP); Tadahiro Ohmi, Miyagi (JP)

( * ) Notice: Subject to any disclaimer, the term of this patent is extended or adjusted under 35 U.S.C. 154(b) by 229 days.

(21) Appl. No.: 10/543,166

(22) PCT Filed: Jan. 29, 2004

(86) PCT No.: PCT/JP2004/000869

§ 371 (c)(1), (2), (4) Date: Jul. 22, 2005

(87) PCT Pub. No.: WO2004/070798

PCT Pub. Date: Aug. 19, 2004

(65) Prior Publication Data

US 2006/0131553 A1 Jun. 22, 2006

(30) Foreign Application Priority Data

Feb. 7, 2003 (JP) ............................. 2003-030642

(51) Int. Cl.
*H01L 29/04* (2006.01)

(52) U.S. Cl. ....................................... 257/627; 257/628

(58) Field of Classification Search ................. 257/627, 257/628
See application file for complete search history.

(56) References Cited

U.S. PATENT DOCUMENTS 3,476,991 A 11/1969 Mize et al.

(Continued)

FOREIGN PATENT DOCUMENTS

EP 0 354 449 A2 2/1990

(Continued)

OTHER PUBLICATIONS

PCT International Search Report for PCT/JP2004/00869 mailed on May 11, 2004.

(Continued)

*Primary Examiner*—Douglas M Menz
(74) *Attorney, Agent, or Firm*—Rader, Fishman & Grauer PLLC

(57) ABSTRACT

The present invention has been made in order to manufacture a silicon semiconductor substrate used for a semiconductor integrated circuit device, higher in carrier mobility, especially in electron mobility, which is a carrier of an n-type FET, on a {100} plane as a main surface, and provides a silicon semiconductor substrate and a method for manufacturing the same, wherein the conventional RCA cleaning is employed without the use of special cleaning and the surface of the substrate is planarized at an atomic level to thereby decrease the surface roughness thereof without the use of the radical oxidation. The present invention provides a silicon semiconductor substrate comprising: a {110} plane or a plane inclined from a {110} plane as a main surface of the substrate; and steps arranged at an atomic level along a <110> orientation on the main surface.

11 Claims, 9 Drawing Sheets

U.S. PATENT DOCUMENTS

| | | | | |
|---|---|---|---|---|
| 4,768,076 | A | 8/1988 | Aoki et al. | |
| 5,882,952 | A * | 3/1999 | Kizuki et al. | 438/47 |
| 6,589,336 | B1 * | 7/2003 | Ebara et al. | 117/94 |
| 6,667,492 | B1 * | 12/2003 | Kendall | 257/30 |
| 2005/0003648 | A1 * | 1/2005 | Mitani et al. | 438/612 |
| 2006/0148143 | A1 * | 7/2006 | Bedell et al. | 438/162 |

FOREIGN PATENT DOCUMENTS

| | | | |
|---|---|---|---|
| EP | 1 174 928 | A1 | 1/2002 |
| JP | 48-039513 | A | 11/1973 |
| JP | 59-217374 | A | 12/1984 |
| JP | 61-070748 | A | 4/1986 |
| JP | 02-074074 | A | 3/1990 |
| JP | 2000-216378 | A | 8/2000 |
| JP | 2000-286418 | A | 10/2000 |
| JP | 2002289819 | A * | 10/2002 |

OTHER PUBLICATIONS

International Preliminary Report for the Application No. PCT/JP2004/000869 dated Sep. 29, 2005.

* cited by examiner

F I G. 1
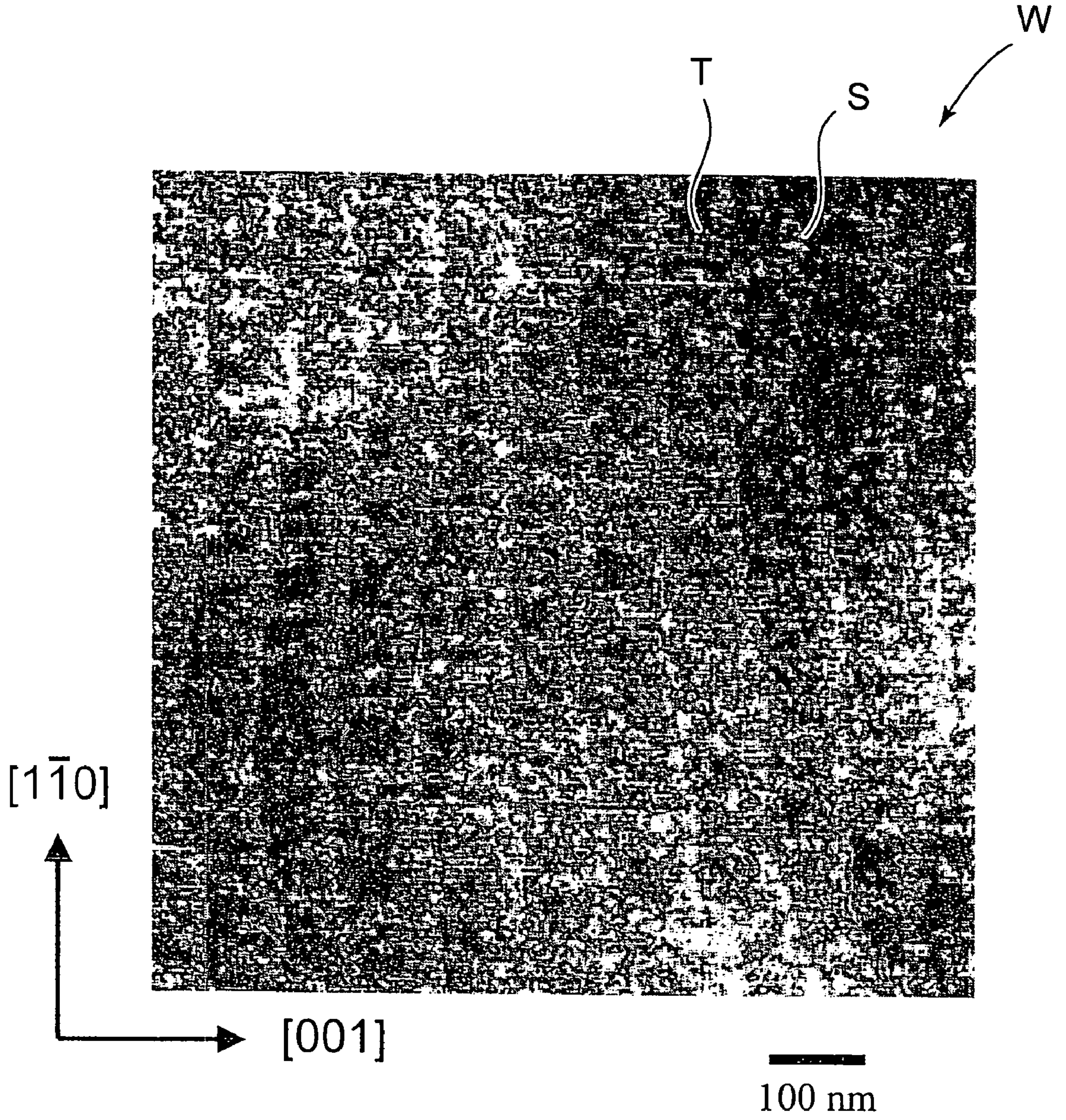

F I G. 3
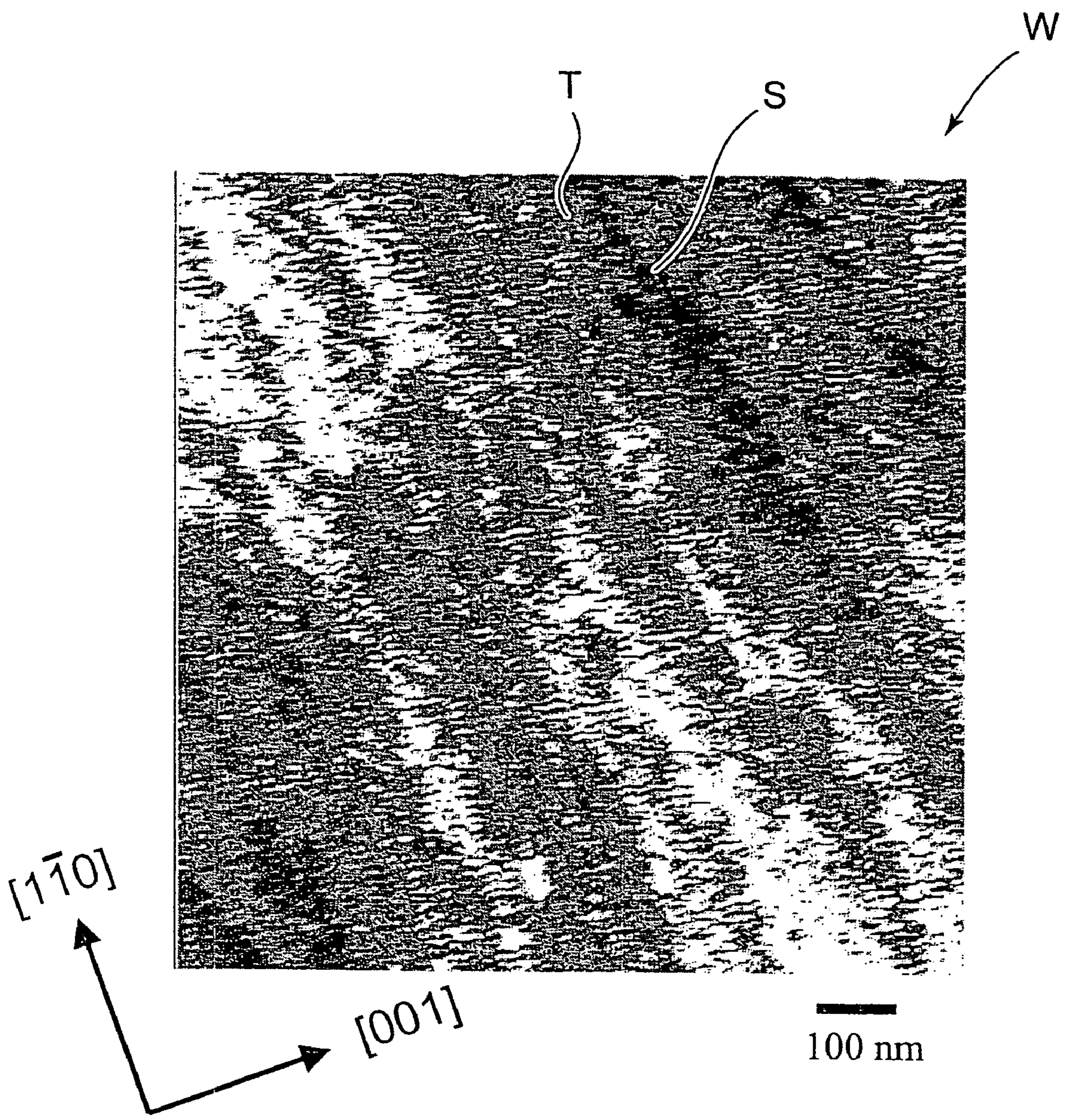

F I G. 4
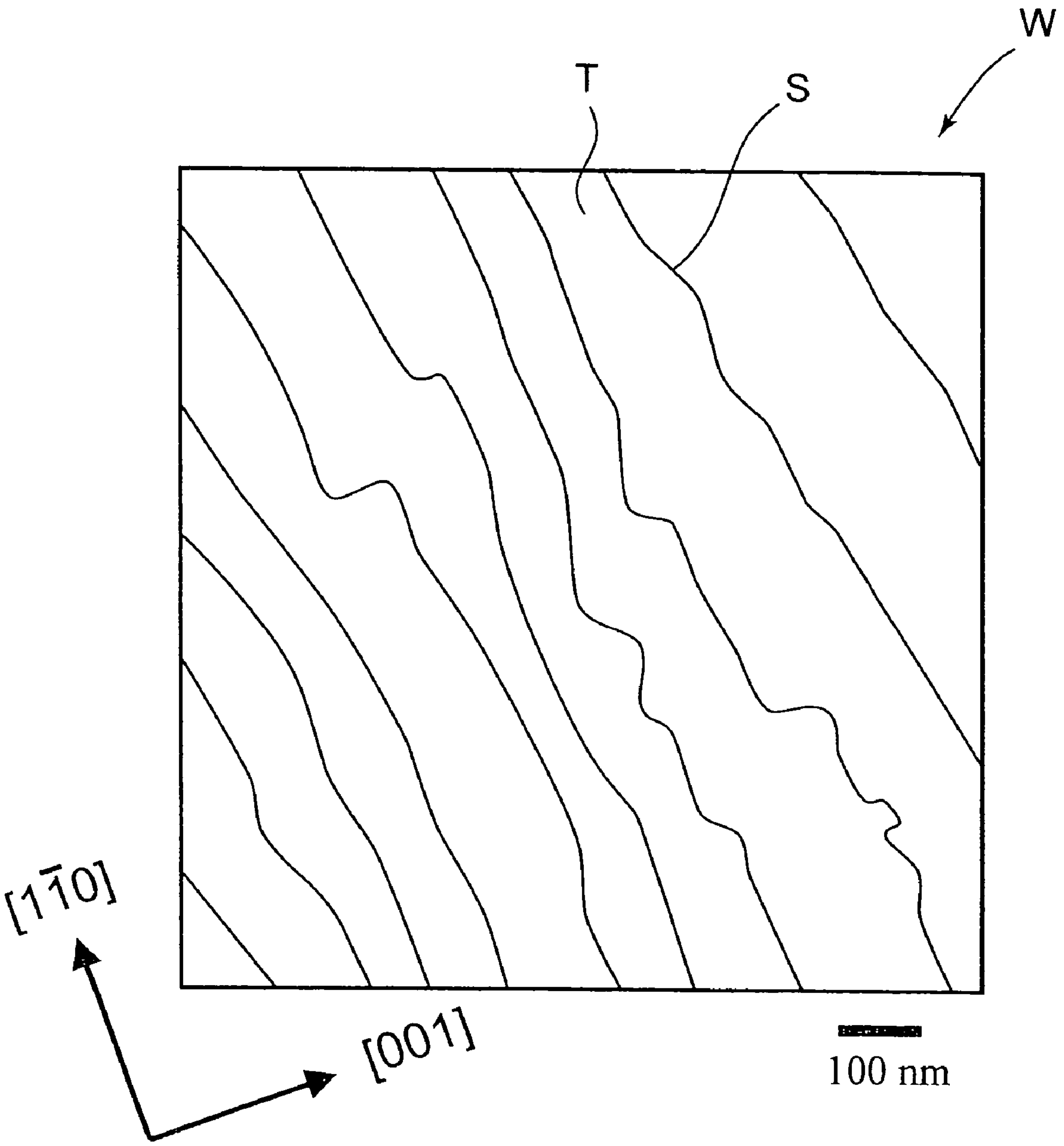

F I G. 5
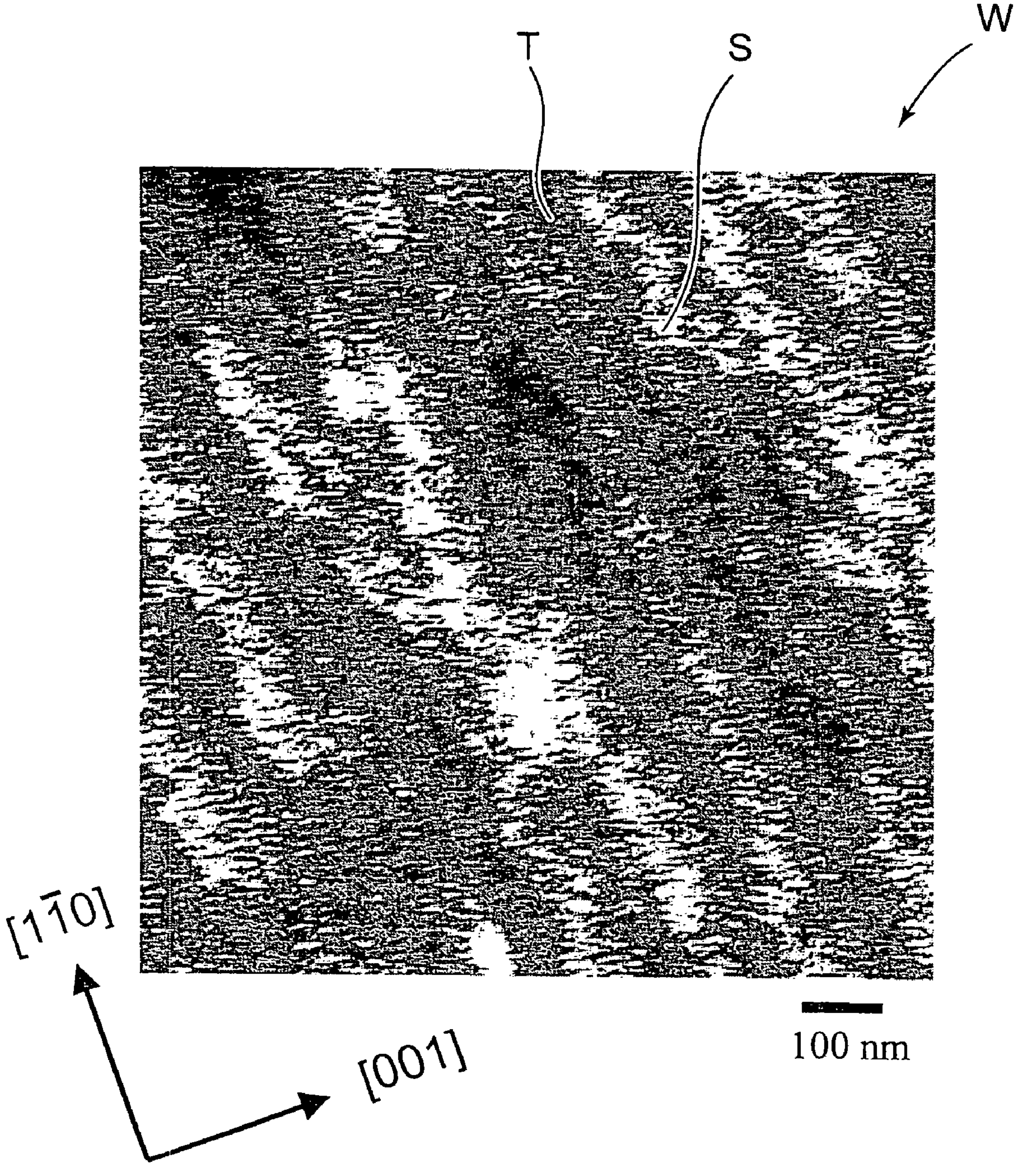

F I G. 6
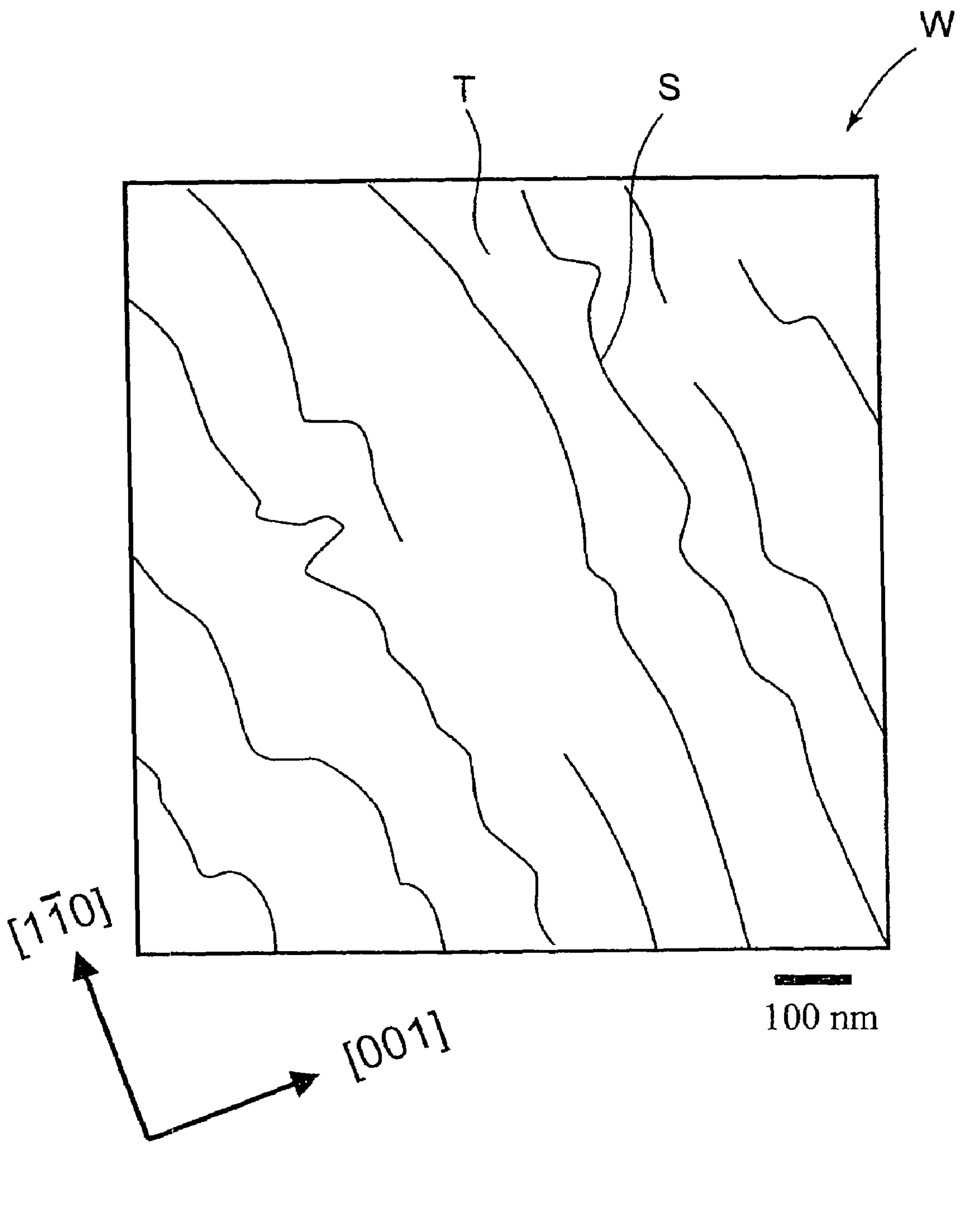

F I G. 7
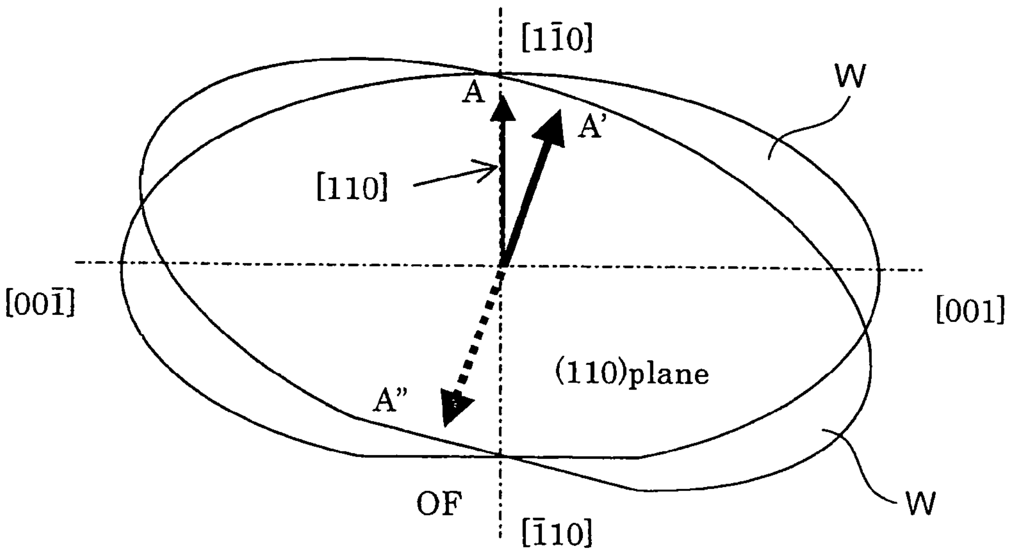
F I G. 8
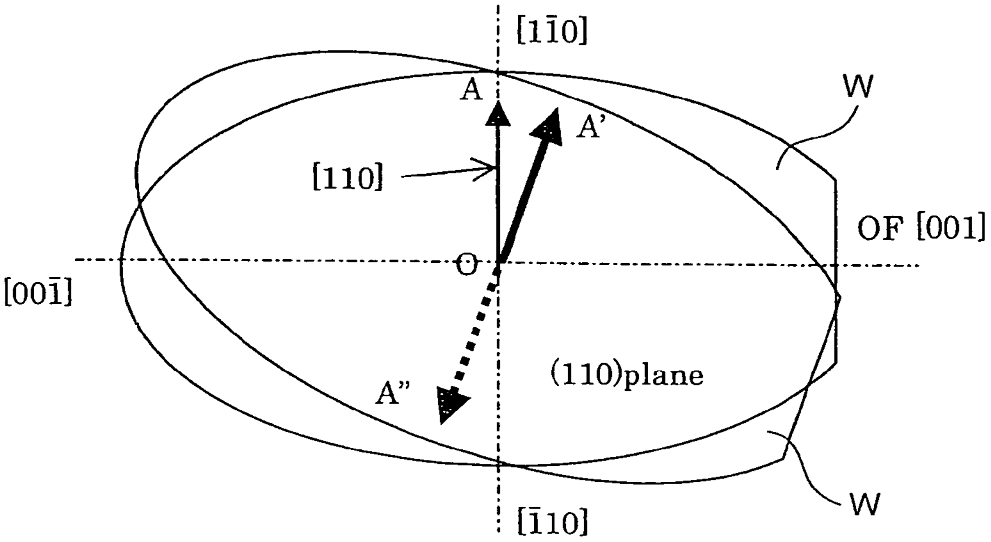

SILICON SEMICONDUCTOR SUBSTRATE AND ITS MANUFACTURING METHOD

TECHNICAL FIELD

The present invention relates to a single crystal silicon semiconductor substrate used in fabrication of a semiconductor integrated circuit device and a method for manufacturing the same.

BACKGROUND ART

A gate insulating film of an MISFET (Metal Insulator Semiconductor Field Effect Transistor) fabricated using a single crystal silicon wafer requires a high performance electric characteristics such as a low leakage current characteristic, a low interface state density and a high resistance to ion implantation and a high reliability. The main stream in techniques for forming a gate insulating film satisfying the requirements is a technique for formation of a silicon dioxide film (hereinafter also simply referred to as an oxide film) using a thermal oxidation. This technique is a so-called MOSFET (Metal-Oxide-Semiconductor Field Effect Transistor). With the thermal oxidation, in a case where a silicon wafer with a {100} plane as a main surface thereof, a good oxide film of a silicon interface characteristic, a dielectric breakdown voltage characteristic and a leakage current characteristic can be ensured. A major reason why a silicon wafers with a {110} plane or a {111} plane other than the {100} plane as a main surface is not used as a substrate of an integrated circuit device is that an interface state density of an oxide film formed on the {110} plane or the {111} plane is high. A wafer with a high interface state density is poor in electric characteristics such as a dielectric breakdown voltage characteristic and a leakage current characteristic.

Hence, a silicon wafer substrate on which MOSFETs are fabricated has been a wafer having a main surface having a {100} plane or an inclined plane with an off-angle of about 4 degrees against the {100} plane.

In a semiconductor device fabricated on a substrate having a {100} plane as a main surface, however, there has been a problem that a p-type FET has current driving ability, that is carrier mobility, about 0.3 time as large as an n-type FET. In recent years, there has been developed a method for forming a good quality insulating film without dependence on a plane orientation of a silicon wafer, that is a radical oxidation method, or a radical nitriding method (2000 Symposium on VLSI Technology, Honolulu, Hi., Jun. 13 to 15, 2000, "Advanced of Radical Oxidation for Improving Reliability of Ultra-Thin Gate Oxide"). With this method applied, a good insulating film can be formed on a wafer surface with a plane other than {100}.

Hence, there is highly feasible a semiconductor integrated circuit device fabricated using a silicon semiconductor substrate having a {110} plane as a main surface thereof on which a carrier mobility in a channel direction of MOSFET may be raised. The inventors fabricated a semiconductor device having a main surface of the {110} plane and evaluated characteristics thereof, whereby various kinds of findings were obtained.

The current driving ability of the above p-type FET on a substrate with a {110} plane is increased against the one on a substrate with a {100} plane by about 2.5 times, while the current driving ability of the n-type FET on a substrate with a {110} plane is reduced against the one on a substrate with a {100} plane, which is contrary to expectation. If the electron mobility in the n-type FET can be raised to a value equal to or more than that in a {100} plane, a semiconductor integrated circuit device using a substrate with a {110} plane will be practically and widely used.

There have effects on carrier mobility impurity scattering, phonon scattering (lattice vibration scattering), and surface roughness scattering. When the influences of these scattering are large, the carrier mobility is decreased. Electron mobility on a surface with a {100} plane is greatly affected by roughness of a silicon surface and it has been made definite that the worse the roughness, the lower the electron mobility (T. Ohmi et al.: IEEE Trans Electron Devices, vol. 137, p. 537, 1992). Thereafter, the following two methods have been proposed for the purpose to reduce the surface roughness. That is, (1) formation of an oxide film on a surface of a semiconductor substrate in an atmosphere including oxygen radicals (M. Nagamine et al., IEDM Tech. Dig. p. 593, 1998) and (2) a cleaning method for a substrate surface except for RCA cleaning (W. Kern et al.: RCA Review, vol. 31, p. 187, 1970).

In the radical oxidation adopted by the above method (1), by the synergistic effects that the oxygen radicals, which are oxidation species, have a high probability of attaching to projections on a silicon surface and oxygen ions of $O^+$ and $O_2^+$ are attracted to the projections charged negatively, the projections are conceivably oxidized with priority, whereby the surface roughness is reduced. By the oxidation in a conventional atmosphere of dry oxygen, the surface roughness is degraded by about 20%, whereas by the radical oxidation, the surface roughness is reduced by about 40%.

The above cleaning method (2) has been disclosed in JP A No. 11-057636. Since a cleaning step with an alkali solution in the RCA cleaning, which has conventionally been widely used, degrades the surface roughness, the cleaning method disclosed in JP A No. 11-057636 is a cleaning process including no alkali solution and has an ability of removing particles, organic contaminant, and metallic impurities, equal to or more than the RCA cleaning. Since this new cleaning process is constituted of 5 (five) steps, the process is hereinafter referred to as five-step cleaning for short in the present specification.

The reason why the surface roughness is degraded in a cleaning step including an alkali solution in the RCA cleaning is that a portion with a weak Si—Si bond is preferentially etched by hydroxide ions (OH ions).

Of the above two methods for decreasing the surface roughness, the radical oxidation method (1) is a method for reducing the surface roughness, whereas the five step cleaning (2) is a method for suppressing roughening in the RCA leaning rather than a method for reducing a surface roughness. In fact, while the surface roughness is degraded by about 50% in the conventional RCA cleaning, the five step cleaning can restrict degradation of the surface roughness to 0% to 10%.

Since the surface roughness is reduced by the radical oxygen method, the surface roughness can be further reduced by repetition of the radical oxidation prior to formation of a gate oxide film, but the repetition may leads to an ill effect. The radical oxidation is conducted at a low temperature of the order in the range of from 300° C. to 500° C. At this temperature, an oxygen donor is formed to change electric resistivity in the interior of a substrate. If oxidation is performed at a temperature of 500° C. or higher, formation and growth of oxygen precipitation nuclei also occur in a surface layer of a substrate, which leads leakage current and dielectric breakdown of a gate oxide film.

To decrease the surface roughness of a silicon semiconductor substrate is to planarize the surface thereof at an atomic level. A mirror polished and cleaned surface of a silicon wafer having a specific crystal plane has numberless irregularities at an atomic level, which lead to surface roughness called microroughness. The microroughness is formed by generation of many microfacets different from the cutting plane by a chemical reaction of a chemical solution used in polishing and cleaning with a silicon surface.

Since a silicon wafer sliced so as to have a {111} plane as a cutting plane is easy to form a planar surface at an atomic level since a {111} plane itself is a facet plane. Y. J. Chabal et al. have publicly reported that dangling bonds (covalent bonds without counterparts) of silicon atoms at a surface are stabilized at terminating portions by joining hydrogen atoms thereto, thereby the surface being planarized (Y. J. Chabal et al., J. Vac. Sci. & Technol. Vol. A7, pp. 2104, 1989).

It has been made clear that a main surface of a substrate having a {111} plane as the main surface thereof is slightly inclined toward a [112] orientation or a [112] orientation by a few degrees, and is cleaned with an ammonium fluoride aqueous solution, whereby steps and terraces are formed on the surface at an atomic level with the result that the surface is allowed to be flat at an atomic level (H. Sakaue et al., Appl. Phys. Lett. Vol. 78, p. 309, 2001). There has been no report, however, that planarization of a mirror polished silicon substrate having a {100} plane as a main surface, which has been most widely used, is realized at an atomic level only by cleaning the substrate.

There has been a report that in an epitaxial silicon semiconductor substrate epitaxially grown on the main surface thereof having an orientation slightly inclined from a {100} plane, the surface roughness is reduced by forming steps and terraces on the main surface thereof (K. Izunome et al.: Jpn. J. Appl. Phys. Vol. 31, pp. L1277.1992). Besides, there has also been a report that steps and terraces are formed on a silicon semiconductor substrate by applying high temperature heat treatment in a hydrogen atmosphere to thereby reduce the surface roughness (O. Vatel et al,: Jpn, J, Appl. Phys. Vol. 32, pp. L1489, 1993). There has been no report, however, on planarization of a surface with a {100} plane at an atomic level to which the present inventors pay attention.

There have been many reports on planarization of a surface with a {100} plane by heat treatment under an ultra-high vacuum. It is difficult to introduce such a technique into a manufacturing process for a large diameter silicon substrate with a diameter of 200 mm or larger because of scale-up of a heat treatment furnace and decrease in productivity.

In aspects of manufacture and supply of silicon semiconductor substrates, an improvement on the surface roughness by the radical oxidation increases the number of the steps to thereby reduce productivity. In the current silicon substrate manufacturing process, it is general to adopt a process to apply the RCA cleaning after mirror polishing. Hereinafter, a silicon semiconductor substrate that is polished and cleaned is referred to as a mirror polished silicon semiconductor substrate. A silicon semiconductor substrate as a general term collectively includes an epitaxial silicon semiconductor substrate and the like. The surface roughness of a mirror polished silicon semiconductor substrate has a root mean square roughness (Rms) of the order of 0.12 nm. A device maker fabricating semiconductor integrated circuit devices applies the RCA cleaning to a silicon semiconductor substrate after accepting it. As described above, the RCA cleaning treatment generally leads to degradation of the surface roughness.

The Rms of a silicon semiconductor substrate after RCA cleaning in device makers is generally on the order of 0.18 nm. In a case where, in order to form a gate oxide film on the substrate, an oxide film with a thickness of the order of 5 nm is formed in a conventional dry oxygen atmosphere, the Rms of the interface is degraded to 0.22 nm. On the other hand, in a case where an oxide film with a thickness of the order of 5 nm is formed by radical oxidation after the radical sacrifice oxidation, the Rms is of the order of 0.08 nm, thereby the surface roughness being greatly reduced. While it could also be one method for decreasing the surface roughness to introduce the radical sacrifice oxidation step into a silicon semiconductor substrate maker, it leads to increase in number of steps with reduction in productivity. Accordingly, in a case of manufacturing a silicon semiconductor substrate used in fabrication of a semiconductor integrated device, it is necessary to manufacture a silicon semiconductor substrate low in surface roughness without applying sacrifice oxidation such as radical oxidation or special cleaning.

DISCLOSURE OF THE INVENTION

The present invention has been made in order to manufacture a silicon semiconductor substrate used for a semiconductor integrated circuit device, higher in carrier mobility, especially in electron mobility, which is a carrier of an n-type FET, on a {100} plane as a main surface, and it is an object of the invention to provide a silicon semiconductor substrate and a method for manufacturing the same, wherein the conventional RCA cleaning is employed without the use of special cleaning such as the five step cleaning and the surface of the substrate is planarized at an atomic level to thereby decrease the surface roughness thereof without the use of the radical oxidation.

In order to achieve the above object, a first aspect of a silicon semiconductor substrate of the present invention is a silicon semiconductor substrate comprising: a {110} plane or a plane inclined from a {110} plane as a main surface of the substrate; and steps arranged at an atomic level along a <110> orientation on the main surface. The plane inclined from the {110} plane is preferably a plane inclined from the {110} plane toward a <100> orientation.

The greatest feature of employing a silicon semiconductor substrate with a {110} plane or a plane inclined from a {110} plane as a main surface in a semiconductor integrated circuit device is that hole mobility in a p-type FET in a <110> orientation is higher than in a case of a {100} plane by about 2.5 times. Therefore, in a semiconductor integrated circuit device in which electron mobility of an n-type FET in any of these silicon semiconductor substrates is increased to a value higher than electron mobility of the {100} plane, by forming a channel direction in which electrons and holes flow in the <110> orientation, miniaturization of a circuit device can be further realized. However, it is the current state of the art that a silicon semiconductor substrate having the {110} plane with no step at an atomic level in the <110> orientation as a main surface has a surface roughness that is not a level equal to or less than surface roughness of the {100} plane and electron mobility thereof is less than that of the {100} plane.

In order to decrease surface roughness, surface planarization at an atomic level is required. By making steps on a surface, terraces are formed between the steps and each terrace surface is a flat surface at an atomic level. By making an edge of the step in a <110> orientation, carriers flowing along the <110> orientation flow directly under a flat terrace surface or flow without suffering scattering due to a level difference between the steps, thereby an influence of scattering due to surface roughness being decreased and high mobility being realized. Incidentally, the edge of the step is not linear at an atomic level with irregularities by a few atoms, the portion being called a kink. Therefore, the step along the <110> orientation means a step arranged along the <110> orientation with a magnitude of the micrometer order.

In the first aspect of a silicon semiconductor substrate of the present invention, a silicon single crystal thin film can be formed by means of an epitaxial growth method on a surface of the silicon semiconductor substrate having a plane inclined from a {110} plane as a main surface. A silicon semiconductor substrate with a silicon single crystal thin film formed thereon by means of the epitaxial growth method, namely an epitaxial silicon semiconductor substrate, is hereinafter also referred to as an epitaxial silicon semiconductor substrate of the present invention.

Epitaxial growth on a silicon semiconductor substrate has been explained in a model where silicon atoms are piled up at kinks of steps formed on terraces to thereby grow the steps two-dimensionally. On a surface of a mirror polished silicon semiconductor substrate having a {110} plane as a main surface without slight inclination in an as-polished and cleaned state, terraces and steps are not formed by ordinary RCA cleaning but numberless microfacets are present. This is a primary factor of degradation in surface roughness. When performing epitaxial growth on the surface, numberless microfacets play a role as kinks, thereby the silicon atoms being piled up uniformly. Therefore, the steps and terraces arranged along a <110> orientation are not formed.

In a case of an epitaxial silicon semiconductor substrate of the present invention, though a main surface of a mirror polished silicon semiconductor substrate prior to epitaxial growth is a surface slightly inclined from a {110} plane, terraces and steps are not observed, but when the surface is subjected to the epitaxial growth with silicon atoms, terraces and steps are formed in the course of the growth. Since the surface of a terrace is flat at an atomic level, a surface roughness is improved. A mirror polished silicon semiconductor substrate with slight inclination has a latent cause of forming terraces and steps. By slightly inclining a main surface of a substrate toward a <100> orientation, steps are generated in parallel to a <110> orientation in which carriers flow, so that carriers may be flowed directly under the terrace surfaces that are flat surfaces each between the steps. Hence, no scattering of carriers occurs due to level differences of the steps.

In the first aspect of a silicon semiconductor substrate of the present invention, the silicon semiconductor substrate having the plane inclined from the {110} plane toward the <100> orientation as the main surface can also be subjected to heat treatment in a hydrogen gas atmosphere, an argon gas atmosphere or an atmosphere of a mixture thereof (hereinafter this substrate may be referred to as a heat treated silicon semiconductor substrate). In a silicon substrate having the slightly inclined {110} plane as a main surface, heat treated at high temperature in the hydrogen gas atmosphere, argon gas atmosphere or the atmosphere of a mixture of both gases, there are also formed steps and terraces on the surface of the substrate by rearranging silicon atoms on the surface in the high temperature treatment. By selecting the <100> orientation as a direction of the slight inclination, steps are generated in parallel to a <110> orientation in which carriers flow, so that carriers can be flowed directly under the terrace surfaces each of which is a flat surface between the steps. Hence, no scattering of carriers occurs due to level differences of the steps either.

A second aspect of a silicon semiconductor substrate of the present invention is a silicon semiconductor substrate having a plane inclined from a {110} plane toward a <100> orientation as a main surface and the surface thereof is mirror polished (hereinafter the silicon semiconductor substrate may be referred to as a mirror polished silicon semiconductor substrate). As described above, the silicon substrate having the plane inclined from the {110} plane toward the <100> orientation the surface of which is as polished and as cleaned has neither steps nor terraces, whereas by subjecting the substrate to epitaxial growth or heat treatment in an atmosphere of hydrogen gas or argon gas, the steps and the terraces can be formed, so that a surface of the silicon substrate inherently has a cause of forming the steps and the terraces. The steps and terraces can be formed in a cleaning step or a heat treating step in an early process for fabricating a semiconductor integrated circuit device.

The slight inclination angle of the silicon semiconductor substrate of the present invention is preferably 0 degree or more and less than 8 degrees. A surface inclined from a {110} plane by an angle of 8 degrees toward a <100> orientation is another low index plane {551}, and the {551} plane is necessary to be further slightly inclined in order to form steps and terraces thereon. Hence, a slight inclination angle of the substrate is preferably less than 8 degrees. With a larger slight inclination angle, a width of each of the terraces gets smaller and a density of the steps increases. Since a level difference of a monoatomic layer step is 0.192 nm, a calculated terrace width in a case of 8 degrees is 1.36 nm, and since a level difference of diatomic layer step is 0.394 nm, a terrace width is 2.73 nm; therefore, a terrace width and a step level difference are on the same order. With a higher step density, a kink density increases and two-dimensional epitaxial growth using the steps becomes difficult and hence neither steps nor terraces arranged in a specific direction are formed. The range of a slight inclination angle includes 0 degree due to an issue associated with an apparatus precision. When wafers are actually sliced from a crystal ingot, a surface of a wafer generally has an error of the order of 10 minutes from a target plane set to 0 degree because of a precision in angular setting of a cutting machine and an orientation measuring instrument. Hence, it is extremely rare that an actual inclination angle of a wafer which has nominally an inclination angle of 0 degree becomes completely 0 degree.

In the silicon semiconductor substrate of the present invention, it is preferable that an orientation flat or a notch is formed in the <110> orientation. With such a construction adopted, the same inclination direction is ensured on front and back surfaces of each of wafers sliced from a single crystal ingot and hence the selection control of the front and back surfaces of each wafer is not necessary, so that there may be removed a risk to mistake a selection between the front and back surfaces.

A first aspect of a manufacturing method for a silicon semiconductor substrate of the present invention is to manufacture the silicon semiconductor substrate of the first aspect of the present invention, which comprises the steps of: preparing a silicon semiconductor substrate having a plane inclined from a {110} plane toward a <100> orientation as a main surface; and growing a silicon single crystal thin film by means of an epitaxial growth method on the main surface.

A second aspect of a manufacturing method for a silicon semiconductor substrate of the present invention is to manufacture the silicon semiconductor substrate of the first aspect of the present invention, which comprises the steps of: preparing a silicon semiconductor substrate having a plane inclined from a {110} plane toward a <100> orientation as a main surface and heat treating the silicon semiconductor substrate in an atmosphere of hydrogen, argon or a mixture thereof.

BRIEF DESCRIPTION OF THE DRAWINGS

FIG. 1 is an AFM image showing steps and terraces formed on a surface of an epitaxial silicon semiconductor substrate with a slight inclination angle of 0.1 degree in Example 1.

FIG. 3 is an AFM image showing steps and terraces formed on a surface of an epitaxial silicon semiconductor substrate with a slight inclination angle of 7.9 degrees in Example 1.

FIG. 4 is a schematic view of FIG. 3.

FIG. 5 is an AFM image showing steps and terraces formed on a surface of a silicon semiconductor substrate heat treated in a hydrogen atmosphere with a slight inclination angle of 0.1 degree of the present invention.

FIG. 6 is a schematic view of FIG. 5.

FIG. 7 is an explanatory view showing the fact that front and back surfaces of a silicon semiconductor substrate of the present invention are equivalent to each other by forming an orientation flat in a <110> orientation.

FIG. 8 is an explanatory view showing the fact that when an orientation flat is formed in a <100> orientation, front and back surfaces of a silicon semiconductor substrate of the present invention are not equivalent to each other and hence the selection control of the front and back surfaces is necessary.

BEST MODE FOR CARRYING OUT THE INVENTION

Description will be given of embodiments of the present invention below based on the accompanying drawings and it is needless to say that the examples shown in the figures are presented by way of illustration only and various modification or variations can be implemented as far as not departing from the technical concept of the present invention.

Figure 2:
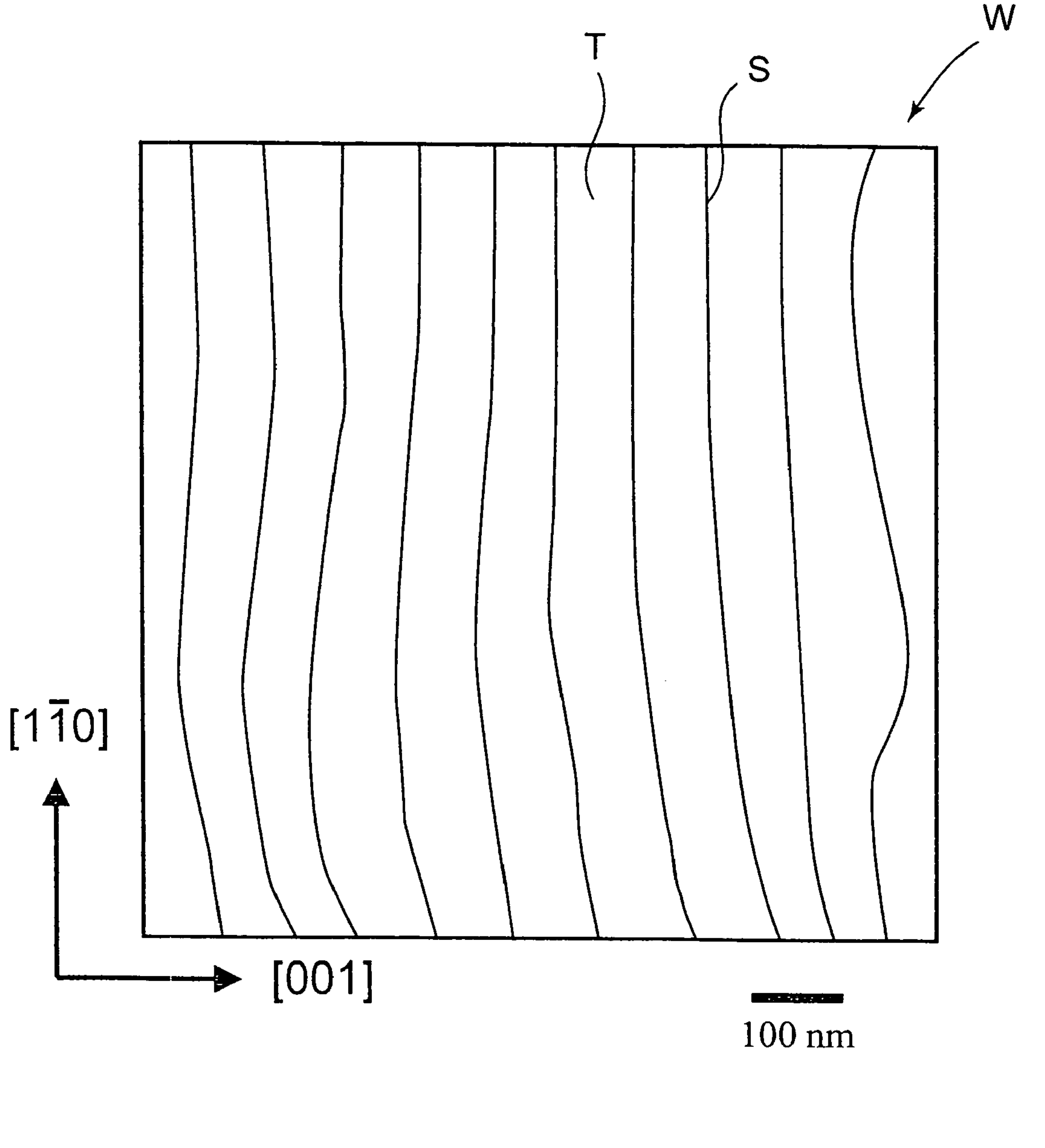
FIG. 2 is a schematic view of FIG. 1.

First of all, description will be given of a silicon semiconductor substrate according to the present invention using FIGS. 1 to 6. FIG. 1 shows an AFM (Atomic Force Microscope) image of an epitaxial silicon semiconductor substrate (W) of the present invention having a {110} plane inclined toward a <110> orientation by 0.1 degree and FIG. 2 is an schematic view of the AFM image of FIG. 1. FIG. 3 shows an AFM image of an epitaxial silicon semiconductor substrate (W) of the present invention having a {110} plane inclined toward a <110> orientation by 7.9 degree as a main surface and FIG. 4 is a schematic view of the AFM image of FIG. 3. FIG. 5 shows an AFM image of a silicon semiconductor substrate (W) heat treated in an atmosphere of hydrogen having a plane inclined from a {110} plane toward a <110> orientation by 0.1 degree as a main surface and FIG. 6 is a schematic view of the AFM image of FIG. 5.

A silicon semiconductor substrate (W) of the present invention has a {110} plane or a plane inclined from a {110} plane as a main surface, and steps (S) at an atomic level arranged along a <110> orientation on the main surface (Examples shown in FIGS. 1 to 6 indicate the cases each where a main surface is a plane inclined from a {110} plane).

In order to decrease surface roughness of the silicon semiconductor substrate (W), surface planarization at an atomic level is necessary. By forming steps (S) on the silicon semiconductor substrate (W), terraces (T) are formed between the steps (S) and each surface of the terraces (T) is a planar surface at an atomic level. If the edge of the step (S) is in a <110> orientation, carriers flowing in a <110> orientation flows directly under a flat surface of the terrace (T) or flows without scattering to be caused by the steps (S), with the result that there may be reduced an influence of scattering from surface roughness to realize high mobility. Incidentally, the edge of the step (S) is not linear at an atomic level but has irregularities due to a few atoms, the portion being called a kink. Therefore, the steps (S) along a <110> orientation mean the steps (S) on the average with a magnitude of the micrometer order arranged along a <110> orientation.

In order to enhance carrier mobility in a semiconductor integrated circuit device formed on a surface of a {110} plane or a surface inclined from a {110} plane, there is necessarily planar at an atomic level the surface in a <110> orientation in which carriers flow. If steps can be formed averagely along a <110> orientation on a surface of the silicon semiconductor substrate having a {110} plane or a plane inclined from a {110} plane as a main surface, carriers can flow in a <110> orientation directly under planar surfaces of terraces generated between the steps. An epitaxial silicon semiconductor substrate of the present invention is contrived in order to form steps in a <110> orientation and prepared by forming a silicon single crystal thin film in epitaxial growth on the surface of the mirror polished silicon semiconductor substrate having a plane inclined from the {110} plane toward the <100> orientation as the main surface.

Then, description will be given of forming an orientation flat or a notch in the <110> orientation on a silicon semiconductor substrate having a plane inclined from a {110} plane toward in a <100> orientation as a main surface using FIG. 7. FIG. 7 is an explanatory view showing the fact that front and back surfaces of a silicon semiconductor substrate of the present invention are equivalent to each other by forming an orientation flat in a <110> orientation. One effect of the present invention is not to necessitate selection of a front or back surface of the silicon semiconductor substrate. In FIG. 7, there is shown a case where a {110} plane of the silicon semiconductor substrate is specified as the (110) plane and an orientation flat OF (since the context here applies to a case of a notch, an orientation flat is, hereinafter, adopted for description) is formed in the [$\bar{1}$10] orientation. When an axis in the [110] orientation (the arrow mark OA) perpendicular to the (110) plane is inclined toward the [001] orientation, the axis changes to a new axis shown the arrow mark OA' in the figure. Thereby, a main surface changes to a plane perpendicular to the new arrow mark OA'. In a case where the wafer is turned upside down and the back surface side is polished, an inclination orientation of the back surface is an arrow mark OA" shown on the back surface side and is the same direction as the orientation flat OF. In other words, an inclination direction on the basis of the orientation flat OF is the same direction in respect of turnover between the front and back surfaces. Therefore, in a fabrication process for a silicon semiconductor substrate, there can be provided a silicon semiconductor substrate with a crystallographically equivalent structure on the basis of the orientation flat OF without selection of a front or back surface.

For comparison, FIG. 8 shows a case where an orientation flat of the silicon semiconductor wafer (W) is formed in the [001] orientation. In the same way as FIG. 7, when an axis in the [110] orientation (the arrow mark OA) perpendicular to the (110) plane is inclined toward the [001] orientation, the axis changes to a new axis shown the arrow mark OA' in the figure. Thereby, a main surface changes to a plane perpendicular to the new arrow mark OA'. In a case where the wafer is turned upside down and the back surface side is polished, an inclination orientation of the back surface is an arrow mark OA" shown on the back surface side and is the direction rotated by 180 degrees against the orientation flat OF. A wafer has an inclination orientation inclined toward the direction ([001]) of the orientation flat, while another wafer has an inclination orientation inclined toward the direction opposite to the direction ([001]) of the orientation flat. Therefore, in a device fabrication process for fabricating a semiconductor device where silicon semiconductor substrates are aligned in a direction on the basis of an orientation flat and subjected to various treatment, there is present a mixture of wafers having inclination orientations different by 180 degrees, so that devices with the same characteristic cannot be fabricated.

A first aspect of a method for manufacturing a silicon semiconductor substrate of the present invention comprises the steps of: preparing a silicon semiconductor substrate having a plane inclined from a {110} plane toward a <100> orientation as a main surface; and growing a silicon single crystal thin film by means of an epitaxial growth method on the main surface. Using the above method, the silicon semiconductor substrate of the present invention is manufactured.

A second aspect of a method for manufacturing a silicon semiconductor substrate of the present invention comprises the steps of: preparing a silicon semiconductor substrate having a plane inclined from a {110} plane toward a <100> orientation as a main surface; and heat treating the silicon semiconductor substrate in an atmosphere of hydrogen, argon or a mixture thereof. Using the above method, the silicon semiconductor substrate of the present invention is manufactured.

EXAMPLES

While further detailed description will be given of the present invention using Examples below, and it is needless to say that the Examples are presented by way of illustration only and not to be construed by way of limitation.

Example 1

Wafers were manufactured by slicing a silicon single crystal pulled in the [110] orientation in the states inclined toward the [001] orientation by 0 degree, 0.1 degree, 1.0 degree, 2.0 degrees, 4.0 degrees, 6.0 degrees, 7.9 degrees and 10.0 degrees. The crystal was boron doped and of a p-type. Electric resistivity thereof was in the range of from 10 to 12 Ωcm. A diameter thereof was 150 mm. Sliced wafers were processed into mirror polished wafers by the use of ordinary chemical mechanical polishing and thereafter, they were subjected to RCA cleaning. Epitaxial growth was carried out on the mirror polished silicon semiconductor substrates to form a silicon single crystal thin film with a thickness of about 5 μm. Trichlorosilane ($SiHCl_3$) was employed as a raw material gas and the thin film was grown in a hydrogen atmosphere at a reaction temperature of 1130° C.

Figure 9:
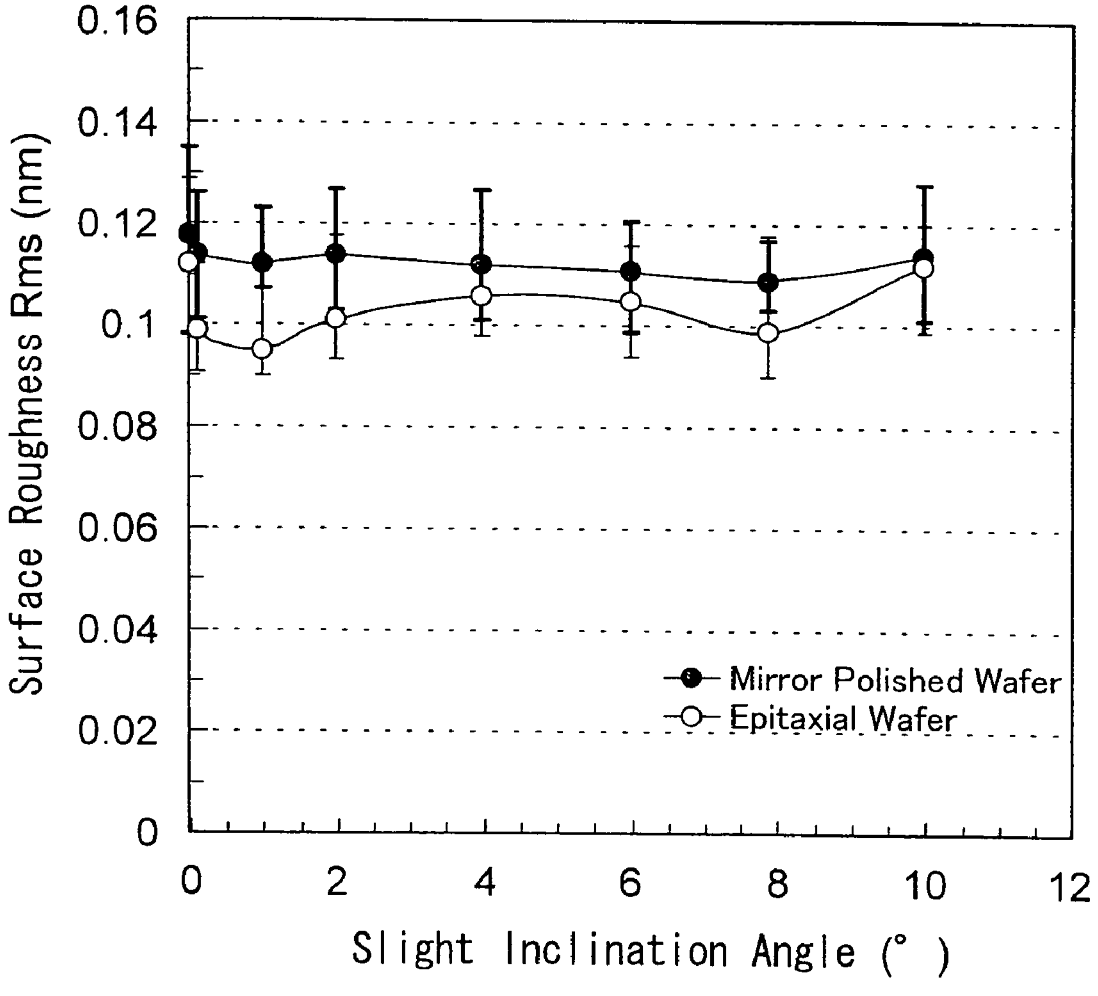
FIG. 9 is a graph showing dependence on a slight inclination angle of a surface roughness (Rms) of each of an epitaxial silicon semiconductor substrate and a mirror polished silicon semiconductor substrate of the present invention in Example 1.

Measurement of surface roughness was implemented with SPA360 manufactured by SEIKO INSTRUMENTS Co. capable of measuring unevenness on a surface using a function of AFM (Atomic Force Microscope) and the surface roughness thus obtained was expressed in Rms. In FIG. 9, there is shown dependence on a slight inclination angle of Rms of an epitaxial silicon semiconductor substrate. For comparison, data of mirror polished silicon semiconductor substrates with respective inclination angles are also shown therein. In a case of a slight inclination angle of 0 degree, Rms of a mirror polished silicon semiconductor substrate and Rms of an epitaxial silicon semiconductor substrate are 0.118 nm and 0.112 nm, respectively.

Incidentally, Rms=0.118 nm of a mirror polished silicon semiconductor substrate having a {110} plane without inclination as a main surface is almost the same as Rms of a mirror polished semiconductor substrate having a {100} plane without inclination as a main surface. Surface roughness of an epitaxial silicon semiconductor substrate with a slight inclination angle of even 0.1 degree is reduced to the value lower than that of a mirror polished silicon semiconductor substrate. An effect of the reduction is recognized at least to the inclination angle of 7.9 degrees. Since a level difference of a monoatomic layer step on a {110} plane as a main surface is 0.192 nm, the width of a terrace in a case of 7.9 degrees is 1.38 nm by calculation, and since a level difference of a diatomic layer step is 0.394 nm, the width of a terrace is 2.76 nm; therefore, a terrace width and a step level difference are on the same order. As step spacing is narrower, a step density is higher; a kink density is higher and hence two-dimensional epitaxial growth caused by the steps is more difficult. With 10.0 degrees, surface roughness is degraded.

FIG. 1 shows an AFM image of surface roughness of an epitaxial silicon semiconductor substrate with a slight inclination angle 0.1 degree and FIG. 2 shows a schematic view of FIG. 1. As shown in FIGS. 1 and 2, there can be recognized steps (S) and terraces (T). A step (S) is on average formed in a <110> orientation. The width of the terrace (T) is about 100 nm. The width (L) of the terrace (T) can be predicted using a formula established between a level difference (h) of a step (S) and a slight inclination angle (a) in a simplified model: $\tan \alpha = h/L$. In a case of {110}, the level difference of the monoatomic layer step is 0.192 nm and the level difference of the diatomic layer step is 0.384. When the slight inclination angle is 0.1 degree, a terrace width between monoatomic layer steps is 110 nm. This value agrees with the prediction. When the slight inclination angle exceeds 1 degree, a terrace width between monoatomic layer steps is estimated 10 nm or less.

It is difficult to observe the steps and terraces in this case with AFM. Since the surface roughness Rms is lower than that of a mirror polished silicon semiconductor substrate, it is considered that the steps and terraces are formed. Thus, it is predicted that the larger the slight inclination angle, the smaller the terrace width, whereas exception is recognized in a case of the slight inclination angle of 7.9 degrees. In FIG. 3, there is shown an AFM image in that case and in FIG. 4, there is shown a schematic view of the AFM image thereof. As clear from FIGS. 3 and 4, the terrace is formed considerably wider than predicted terrace widths of 1.38 nm or 2.76 nm. While an orientation of the steps (S) is mostly a <110> orientation, the step line is curved, which means that growth of the steps (S) is fluctuated. The reason why the considerably wide terrace (T) is formed is that in a case where the main surface is inclined from the {110} plane toward the <100> orientation by 7.9 degrees, the main surface becomes a plane inclined from a {551} plane of a low index plane by 0.15 degree; therefore, the main surface is a plane slightly inclined from a facet plane of the {551} plane. This is presumed from the fact that in a case where a main surface is slightly inclined from a {111} plane of a facet plane toward a <112> orientation, steps and terraces are formed.

Example 2

Figure 10:
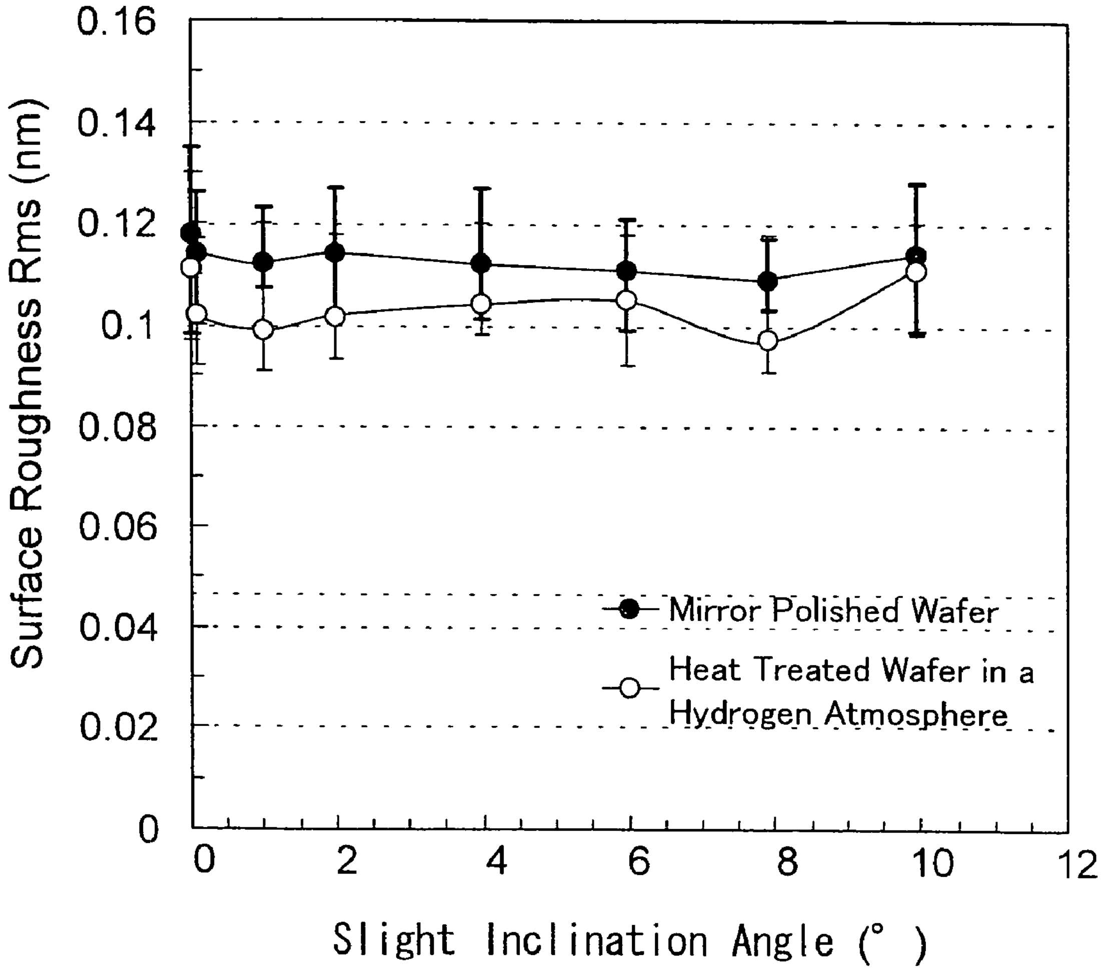
FIG. 10 is a graph showing dependence on a slight inclination angle of a surface roughness (Rms) of a heat treated silicon semiconductor substrate of the present invention in an atmosphere of hydrogen in Example 2.

Then, description will be given of a surface roughness of a heat treated silicon semiconductor substrate. As in a case of an epitaxial silicon semiconductor substrate, wafers were manufactured by slicing a silicon single crystal pulled in the [110] orientation in the states inclined toward the [001] orientation by 0 degree, 0.1 degree, 1.0 degree, 2.0 degrees, 4.0 degrees, 6.0 degrees, 7.9 degrees and 10.0 degrees. Sliced wafers were processed into mirror polished wafers by the use of ordinary chemical mechanical polishing and thereafter, they were subjected to RCA cleaning. The mirror polished silicon semiconductor substrates was subjected to heat treatment in a hydrogen atmosphere at 1150° C. for 1 hr. In FIG. 10, there is shown dependence on a slight inclination angle of Rms of a silicon semiconductor substrate heat treated in a hydrogen atmosphere.

For comparison, data of mirror polished silicon semiconductor substrates are also shown therein. In a case of a slight inclination angle of 0 degree, Rms of a mirror polished silicon semiconductor substrate and Rms of a silicon semiconductor substrate heat treated in a hydrogen atmosphere are 0.118 nm and 0.111 nm, respectively. Dependence on a slight inclination angle of Rms is the same as that of an epitaxial silicon semiconductor substrate. That is, surface roughness of a silicon semiconductor substrate heat treated in a hydrogen atmosphere with a slight inclination angle in the range of from 0.1 degree to 7.9 degrees is reduced to the value lower than that of a mirror polished silicon semiconductor substrate.

FIG. 5 shows an AFM image in a case of a slight inclination angle 0.1 degree and FIG. 6 shows a schematic view of FIG. 5. Though the AFM image is not clearer than in a case of an epitaxial silicon semiconductor substrate, steps and terraces are formed. Thus, though it can be said that steps and terraces are formed with difficulty more than an epitaxial silicon semiconductor substrate, surface roughness Rms of a heat treated silicon semiconductor substrate with a slight inclination angle is reduced to the value lower than that of a mirror polished silicon semiconductor substrate, so that scattering of carriers due to surface roughness can be reduced.

Example 3

Description will be given below of fabrication of a semiconductor device on a silicon semiconductor substrate of the present invention and measurement of carrier mobility thereof. There were used mirror polished silicon semiconductor substrates having respective planes inclined from {110} planes by angles of 0 degree, 0.1 degree and 7.9 degrees as main surfaces, epitaxial silicon semiconductor substrates obtained by growing a silicon single crystal thin film with a thickness of 5 μm on the mirror polished silicon semiconductor substrates, and heat treated silicon semiconductor substrates obtained by heat treating the mirror polished silicon semiconductor substrates in a hydrogen atmosphere. A diameter, an electric resistivity and an oxygen concentration of the mirror polished silicon substrate were 150 mm, of a p-type in the range of from 10 to 12 Ωcm, and 16 ppma (the JEIDA conversion), respectively. The median of the electric resistivity of the epitaxial silicon layer was 11 Ωcm. The heat treatment in a hydrogen atmosphere was performed at 1150° C. for 1 hr. A mirror polished silicon semiconductor substrate having a {100} plane as the main surface without inclination was used as a reference sample. An electric resistivity and an oxygen concentration thereof were almost the same as the above values. Incidentally, JEIDA is an abbreviation of Japan Electronic Industry Development Association (currently, changed to JEITA: Japan Electronic Information Technology Industry Association).

In order to actually prove an effect of improving electron mobility, an n-type field effect transistor was fabricated using the above substrates. A trench was at first formed thereon for the device isolation by means of a STI (Shallow Trench Isolation) method and buried with a silicon oxide film ($SiO_2$). Then, the substrates were subjected to the RCA cleaning and organic materials, particles and metals were removed therefrom and after that, a gate oxide film with a thickness of 5 nm was formed thereon in a dry oxidizing atmosphere. Boron (B) was ion implanted all over the substrate surface in order to control a threshold voltage of the gate.

Next, a polycrystal silicon film was deposited all over the substrate surface by means of a CVD (Chemical Vapor Deposition) method and patterning was carried out thereon to form a polycrystal silicon electrode on a gate oxide film in a transistor forming area. Then, phosphorus (P) was ion implanted at a low concentration to form an $n^-$ source region and an n-drain region to relax a high voltage field. A direction in which electrons flow is a <110> orientation. Then a silicon oxide film was deposited all over the substrate by the CVD method so as to cover the gate electrode and anisotropic etching was applied to the silicon oxide film to form a sidewall insulating film on the sidewall of the gate electrode. Finally, arsenic was ion implanted at a high concentration to form an $n^+$ source region and an $n^+$ drain region. Evaluation was performed on the electron mobility of the n-type field effect transistor thus fabricated.

Table 1 shows the value of the electron mobility in each of the substrates against the reference value of 1 for the electron mobility in the mirror polished silicon semiconductor substrate having a {100} plane as a main surface. The electron mobility of the epitaxial silicon semiconductor substrate having slight inclination is 1.4 times that of the mirror polished silicon semiconductor substrate having the {100} plane as a main surface, which has been widely employed. Even the electron mobility of the silicon semiconductor substrate heat treated in a hydrogen atmosphere having slight inclination is about 1.2 times. The electron mobility of the mirror polished silicon semiconductor substrate having a slight inclination is about 0.8 times that of the substrate having a {100} plane as a main surface, which is inferior, but the above electron mobility is 1.3 times that of the substrate having a {110} plane with no inclination, which reveals an effect of inclination. In this Example, the conventional RCA cleaning was applied in the semiconductor device fabrication process, but there is a possibility to improve the electron mobility further by improving a cleaning method and a heat treatment method. For example, by applying the above described five-step cleaning or the radical sacrifice oxidation treatment, it can be expected that the surface roughness is further improved and the carrier mobility is also increased to a higher value.

TABLE 1

| | Inclination angles ([001] orientation) | | |
|---|---|---|---|
| {100} Substrate | 0° | 0.1° | 7.9° |
| Mirror polishing | 0.62 | 0.81 | 0.79 |
| Epitaxial growth | 0.76 | 1.46 | 1.44 |
| Heat treatment | 0.72 | 1.22 | 1.15 |

INDUSTRIAL APPLICABILITY

As described above, the silicon semiconductor substrate of the present invention is planarized at an atomic level, the surface roughness of the silicon semiconductor substrate can be reduced to a value lower than that of the conventional silicon semiconductor substrate by about 10%, and since the surface steps at an atomic level are formed along a direction in which carriers of a semiconductor device flow, carrier mobility of the semiconductor device can be improved by 40% at most as compared with a case of the conventional silicon semiconductor substrate. By using the silicon semiconductor substrate of the present invention as a substrate of a semiconductor integrated circuit device, a high performance device can be realized. Moreover, according to the method of the present invention, the silicon semiconductor substrate of the present invention can be effectively manufactured.

The invention claimed is:

1. A silicon semiconductor substrate comprising: a plane inclined from a {110} plane as a main surface of the substrate; and a series of steps arranged at an atomic level substantially along a <110> orientation on the main surface, wherein at least most ones of the series of steps extend continuously along the main surface of the substrate.

2. The silicon semiconductor substrate according to claim 1, wherein the plane inclined from the {110} plane is a plane inclined from the {110} plane toward a <100> orientation.

3. The silicon semiconductor substrate according to claim 2, wherein a silicon single crystal thin film is formed by means of an epitaxial growth method on the surface of the silicon semiconductor substrate having the plane inclined from the {110} plane as the main surface.

4. The silicon semiconductor substrate according to claim 2, wherein the silicon semiconductor substrate has the plane inclined from the {110} plane toward the <100> orientation as the main surface the silicon semiconductor substrate having the plane inclined from, the {110} plane toward the <100> orientation is a heat-treated silicon semiconductor substrate having the plane inclined from the {110} plane toward the <100> orientation, the heat-treated silicon semiconductor substrate heat-treated in a hydrogen gas atmosphere, an argon gas atmosphere or an atmosphere of a mixture thereof.

5. A silicon semiconductor substrate having a plane inclined from a {110} plane toward a <100> orientation as a main surface, the surface thereof being mirror polished and having a series of steps arranged at an atomic level substantially along a <110> orientation on the main surface, wherein at least most ones of the series of steps extend continuously along the main surface.

6. The silicon semiconductor substrate according to claim 2, wherein an inclination angle of the silicon semiconductor substrate having the plane inclined from the {110} plane toward the <100> orientation as the main surface is greater than 0 degrees and less than 8 degrees.

7. The silicon semiconductor substrate according to claim 2, wherein an orientation flat or a notch is formed in the <110> orientation.

8. A method for manufacturing a silicon semiconductor substrate, which is the silicon semiconductor substrate according to claim 2, comprising the steps of:

preparing a silicon semiconductor substrate having a plane inclined from a {110} plane toward a <100> orientation as a main surface; and growing a silicon single crystal thin film by means of an epitaxial growth method on the main surface.

9. A manufacturing method for a silicon semiconductor substrate, which is the silicon semiconductor substrate according to claim 2, comprising steps of:

preparing a silicon semiconductor substrate having a plane inclined from a {110} plane toward a <100> orientation as a main surface; and heat treating the silicon semiconductor substrate in an atmosphere of hydrogen, argon or a mixture thereof.

10. The silicon semiconductor substrate according to claim 6 wherein an orientation flat or a notch is formed in the <110> orientation.

11. The silicon semiconductor substrate according to claim 1, each one of the plurality of steps defines a respective edge, each edge of each respective one of the plurality of steps is non-linear at an atomic level along the <110> orientation.

* * * * *